United States Patent [19]

Shimomoto et al.

[11] Patent Number: 4,554,478
[45] Date of Patent: Nov. 19, 1985

[54] PHOTOELECTRIC CONVERSION ELEMENT

[75] Inventors: Yasuharu Shimomoto, Tokyo; Yasuo Tanaka, Kokubunji; Yukio Takasaki, Hachioji; Sachio Ishioka; Toshihisa Tsukada, both of Tokyo; Toru Baji, Kokubunji, all of Japan

[73] Assignee: Hitachi, Ltd., Tokyo, Japan

[21] Appl. No.: 497,841

[22] Filed: May 25, 1983

Related U.S. Application Data

[63] Continuation of Ser. No. 226,879, Jan. 21, 1981, abandoned.

[30] Foreign Application Priority Data

Jan. 21, 1980 [JP] Japan .................................. 55-4622

[51] Int. Cl.⁴ ............................................ H01J 31/38
[52] U.S. Cl. .................................... 313/366; 313/384; 29/572; 29/589
[58] Field of Search ............... 313/384, 366, 385, 386, 313/392, 370, 390; 29/572, 589

[56] References Cited

U.S. PATENT DOCUMENTS

3,350,595 10/1967 Kramer .............................. 313/366
3,800,194 3/1974 Maruyama et al. ............ 313/366 X
4,167,015 9/1979 Hanak ................................ 357/30 X
4,255,686 3/1981 Maruyama et al. ................. 313/366

Primary Examiner—Palmer C. DeMeo
Assistant Examiner—K. Wieder
Attorney, Agent, or Firm—Antonelli, Terry & Wands

[57] ABSTRACT

In a photoelectric conversion element including at least a first electrode and a photoconductive layer having an amorphous material whose indispensable constituent is silicon and which contains hydrogen as an essential constituent element on a predetermined substrate, the present invention discloses a photoelectric conversion element wherein said layer of the amorphous material is disposed on said first electrode via a light transmitting or light semi-transmitting metallic layer for adhesion with respect to said amorphous material. As said metallic layer for adhesion, preferred is a layer consisting of at least one metal selected from the group consisting of Ta, Cr, W, Nd, Mo, V and Ti. Thus, adhesion between said substrate and said amorphous material can be improved.

9 Claims, 10 Drawing Figures

PHOTOELECTRIC CONVERSION ELEMENT

This is a continuation of application Ser. No. 226,879, filed Jan. 21, 1981, now abandoned.

BACKGROUND OF THE INVENTION

This invention relates to a photoelectric conversion element and to a construction of a light-receiving surface that can be used for a photoconductive type image pick-up tube target or a solid state imager.

Figure 1:
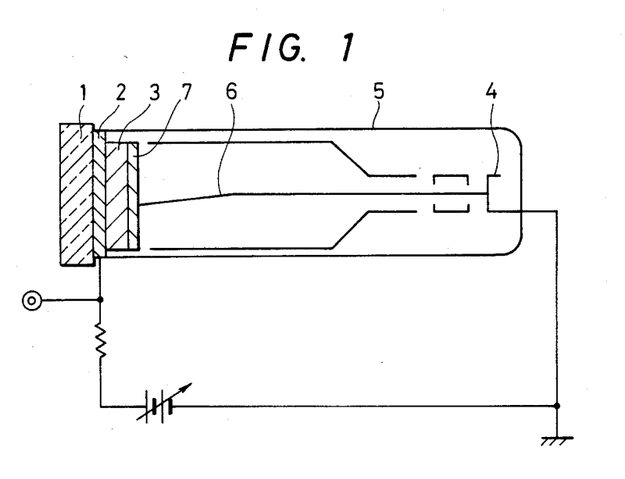
FIG. 1 shows the construction of the image pick-up tube.

As a typical example of the photoelectric conversion element that can be used in a storage mode, there is a photoconductive type image pick-up tube such as shown in FIG. 1. The image pick-up tube consists of a light-transmitting substrate 1 called generally a "face plate", a transparent conductive film 2, a photoconductive layer 3, an electron gun and a jacket 5. An optical image formed on the surface of the photoconductive layer 3 through the face plate 1 is subjected to the photoelectric conversion, is stored as charge patterns on the surface of the photoconductive layer and is read by a scanning electron beam 6 in the time series arrangement.

Generally, a beam landing layer 7 is formed on the surface of the photoconductive layer 3 for the purpose of preventing the inversion and the injection of electrons from the scanning electron beam.

One of the significant characteristics required for the photoconductive layer 3 in this instance is that the charge patterns are not caused to decay by diffusion during the time interval in which specific picture elements are scanned by the scanning electron beam 6 (that is to say, during the storage time).

As an example of the prior art reference that propose to use an amorphous material consisting principally of silicon and containing hydrogen for the abovementioned photoconductive layer, mention can be made of "Appl. Phys. Lett.", 35(4), 15 Aug., 1979, p349-351.

A solid state imager using a photoconductor is disclosed, for example, by INTERNATIONAL ELECTRON DEVICES MEETING, December, 1979, p134-136. However, the photoconductor used in this prior art is Se-Ge-As chalcogenide glass but is not hydrogenated amorphous silicon that is to be employed as the photoconductor in the present invention.

SUMMARY OF THE INVENTION

In the photoelectric conversion element using the abovementioned hydrogenated amorphous silicon, a drawback is found that adhesion between this hydrogenated amorphous silicon and the substrate is not sufficient. Due to this drawback, numerous spots mostly occurs on the surface of the photoelectric conversion element.

As the co-pending U.S. patent applications of the Applicant of this invention for a photoelectric conversion element using the hydrogenated amorphous silicon, there are U.S. patent application Ser. No. 39,580 (pertaining to a photoconductive type image pick-up tube) and Ser. No. 66,230 (pertaining to a solid state imager).

Accordingly, the present invention is directed to solve the abovementioned drawback. To accomplish this object, the present invention forms the layer of a photoconductive amorphous material consisting principally of silicon and containing hydrogen on a first electrode via a metallic film containing at least one member selected from the group consisting of Ta, Cr, W, Nd, Mo, V and Ti. This arrangement provides sufficient binding power between the amorphous material and the substrate.

This metallic film may be either a film of a single substance or its composite film. It may also be a multi-layered film. The abovementioned elements may further form an alloy between them.

It is also possible to use commonly this metallic film as a metallic electrode. In such a case, the metallic film may be disposed as the ordinary electrode. The film thickness generally ranges from 2000 Å to 1μm. If this metallic film is conjointly used as a transparent electrode in a multi-layered construction, it is necessary that the metallic film for adhesion be substantially transparent or semi-transparent. Generally, a thickness of from 5 Å to 100 Å is preferred. If there is an Al electrode or the like therebelow, the metallic film for adhesion may be disposed on the Al electrode. If the metallic film is disposed at such a position where electric conduction is not required, the film thickness is preferably as thin as 20 Å to 200 Å. More preferably, the thickness is from 50 Å to 100 Å. It is also advisable to employ such a method which suitably divides the conductor so as to interrupt its conductivity.

The metallic film may be formed sufficiently by the ordinary sputtering method, for which the conditions are generally as follows. The sputtering method may be either RF sputtering or DC sputtering. As the atmosphere, a dilute gas, especially an argon gas of $5 \times 10^{-4}$ to $1 \times 10^{-2}$ Torr may be used while as an input, about 200 to about 800 W may be used.

The metallic film may be formed also by the ordinary vacuum evaporation method.

The photoconductive film in accordance with the present invention consists of a single layer or a laminate layer. Generally, it is preferred to use an amorphous material containing silicon and hydrogen in such amounts that the single layer or at least one layer of the laminate layer of the abovementioned photoconductive substance contains at least 50%, in terms of number of atoms, of silicon and 5 to 50%, in terms of number of atoms, of hydrogen, and at the same time, the amorphous material has resistivity of at least $10^{10}$ Ohm·cm. It is also possible to use a material in which 0.1% to 50%, in terms of number of silicon atoms, of the abovementioned photoconductive layer is substituted by germanium atoms. Generally, the thickness of the photoconductive film is selected from the range of 100 nm to 20 μm. The amorphous material can be produced sufficiently in accordance with the ordinary reactive sputtering method or with the ordinary decomposition method by means of glow discharge.

DESCRIPTION OF THE PREFERRED EMBODIMENTS

EXAMPLE 1

Figure 2:
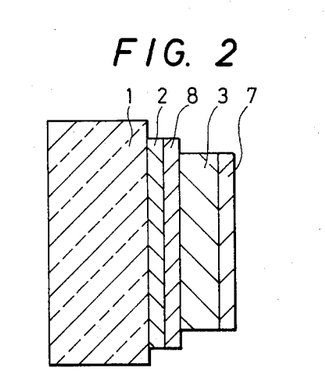
FIG. 2 shows the section of the construction of the photoelectric convertor in accordance with the present invention.

As shown in FIG. 2, a transparent electrode 2 consisting of $SnO_2$ was formed on a glass substrate 1 and was fitted to a substrate holder electrode inside a high frequency sputtering device. On the other hand, a Ta target was mounted onto a target electrode. Next, after the inside of the sputtering chamber was exhausted to a degree of vacuum of $5 \times 10^{-6}$ or below, an Ar gas was introduced into the chamber so as to attain a gas pressure of $1.0 \times 10^{-2}$ Torr.

At this gas pressure, high frequency discharge of 13.56 Mhz with an output of 1 W/cm$^2$ was effected between both electrodes, thereby forming a Ta film 8 on the transparent electrode 2 in a thickness of about 10 Å.

Next, a 99.999% silicon sintered body was mounted to the target electrode of the high frequency sputtering device, and reactive sputtering of the amorphous silicon film 3 was effected on the $SiO_2$ film 8 in the atmosphere of a mixed gas consisting of Ar of $3 \times 10^{-3}$ Torr and H of $2 \times 10^{-3}$ Torr. In this case, the substrate was held at 200° C. The amorphous silicon film thus produced had about 10%, in terms of number of atoms, of hydrogen and resistivity of $10^{14}$ Ohm·cm.

In order to improve the landing characteristics of the electron beam, an $Sb_2S_3$ film 7 was finally vacuum-deposited in a thickness of about 1,000 Å in the Ar gas pressure.

In this manner, the target of the image pick-up tube was completed. In accordance with the present invention, peeling of the amorphous material from the film could be eliminated perfectly. If the photoconductive film has damages of film peeling, numerous spots occur on the picture surface of the image pick-up tube using such a target. This problem could be perfectly eliminated in this embodiment. Furthermore, increase in the dark current due to the film peeling could be prevented and reduced down to about 1/100.

Figure 3:
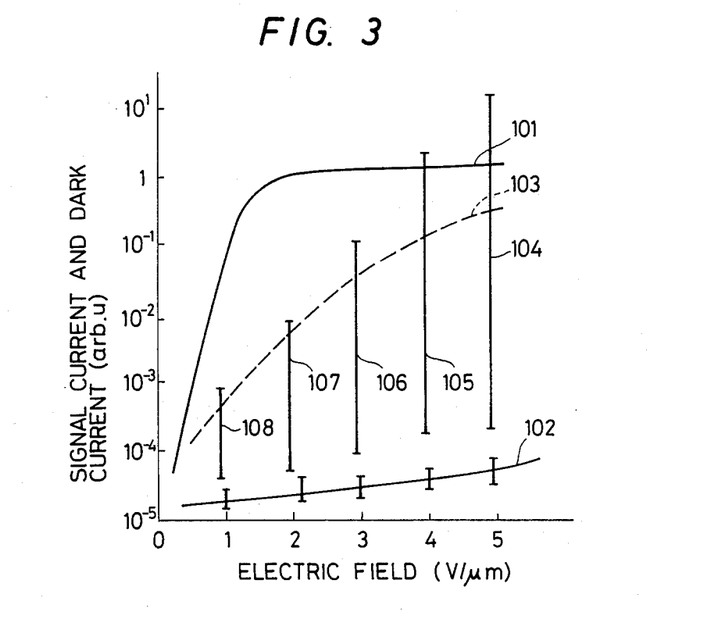
FIG. 3 is a diagram showing the current-voltage characteristics of the target.

FIG. 3 shows the current-voltage characteristics of an amorphous silicon vidicon target. The photocurrent was measured with 10-lux illumination (using blue light) on the face plate. Curves 101 and 102 represent a signal current and a dark current measured for the target in accordance with the present invention, respectively. A curve 103 represents a signal current when the present invention was not used and curves 104 through 108 represent the dark current in each electric field when the present invention was not used. The signal level in these cases are inferior to that in the present invention, and the difference is further remarkably observed with respect to the dark current characteristics. If the film peeling occurs, the target exhibits an extremely large dark current as shown in FIG. 3 so that it can not be used in practice.

By contrast, excellent current-voltage characteristics could be obtained in accordance with the present invention.

EXAMPLE 2

A transparent electrode consisting of $SnO_2$-$In_2O_3$ was formed on a glass substrate and any one of the following metallic films was formed thereon by sputter evaporation in the same way as in Example 1. Futher, a silicon layer containing 15 atom% of hydrogen was formed in a thickness of 2 μm by the reactive sputtering method. Finally, an $Sb_2S_3$ film was vacuum-evaporated in the Ar gas pressure, thereby providing a target for an image pick-up tube. Each target exhibited excellent characteristics in the same way as the target of Example 1.

TABLE 1

| Metal | Film thickness (Å) |
|---|---|
| Cr | 10 |
| W | 10 |
| Nd | 10 |
| Mo | 10 |
| V | 10 |
| Ti | 10 |
| Composite film of Cr and W | 10 |
| Composite film of Ta and Mo | 10 |

Example 3

This embodiment relates to a solid state imager using a photoconductive layer.

This solid state imager has a construction in which plural solid elements each having a photoelectric conversion function and a signal storage function are so arranged that each solid element corresponds to one picture element to form an image surface, and the resulting image surfaces are sequentially scanned thereby to convert external picture information into electric signals. Especially, an example of the solid state imager in which the photoconductive layer forming the image surfaces covers a semiconductor substrate having formed thereon a switch, a scanning circuit and the like, is known from Japanese Patent Laid-Open No. 10715/1976 and so on.

Figure 4:
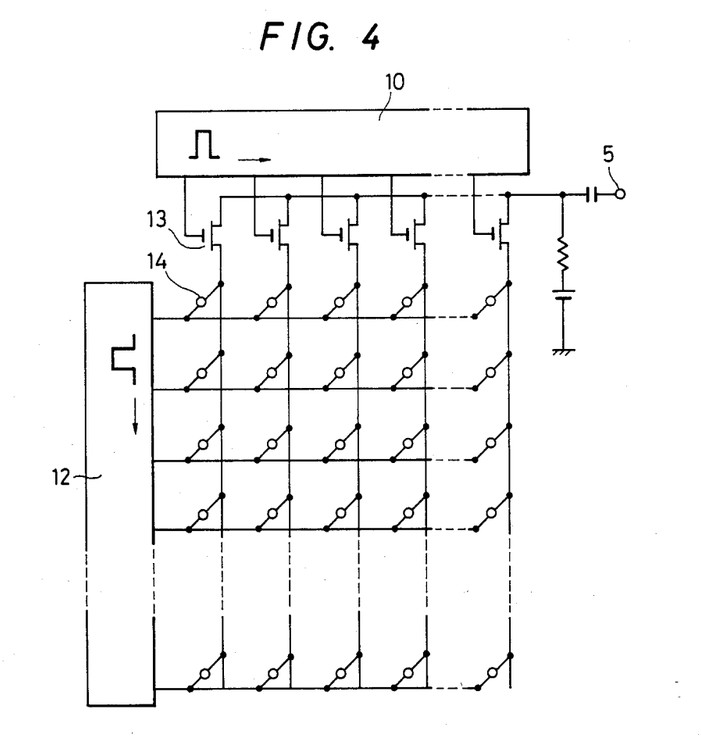
FIG. 4 shows the principle of the solid state imager.

FIG. 4 shows the principle of the solid state imager. The picture elements 14 are arranged in the matrix form and are read out one by one by an XY address system. Selection of the picture elements is made by means of a horizontal scanning signal generator 11 and a vertical scanning signal generator 12. Reference numeral 13 represents switch portions connected to the picture elements and reference numeral 5 represents output terminals.

Figure 5:
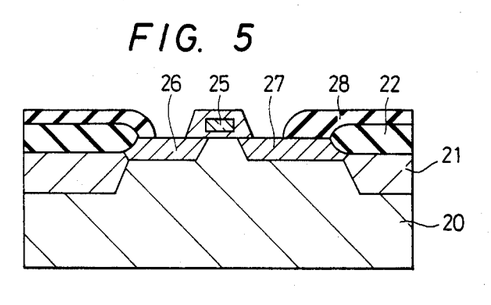
FIGS. 5 through 7 are sectional views showing the principal portions of the solid state imager of the present invention during the production step thereof.
Figure 6:
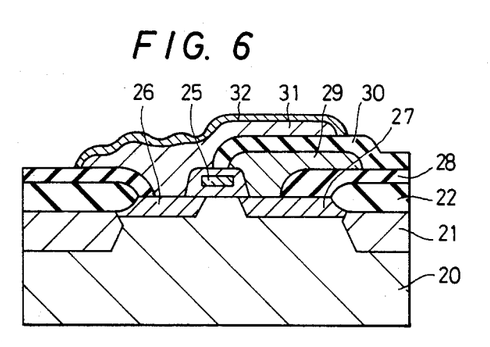
Figure 7:
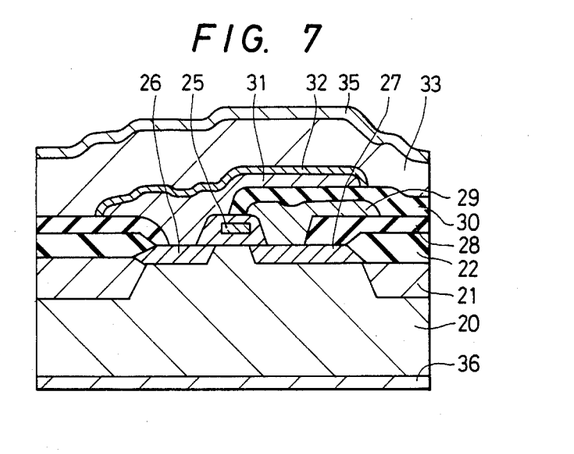

FIGS. 5 through 7 are sectional views of the picture element portions each showing the production method of the solid state imager in accordance with the present invention. The switching circuit to be formed on the semiconductor substrate, the scanning circuit portions and the like were produced in accordance with the ordinary fabrication method of a semiconductor device. An $SiO_2$ film as thin as about 800 Å was formed on a P-type silicon substrate 20 and an about 1,400 Å-thick $Si_3N_4$ film was then formed at a predetermined position of this $SiO_2$ film.

The $SiO_2$ film was formed by the ordinary CVD process while the $Si_2N_3$ film was formed by the CVD process while passing $Si_3NH_4$, $NH_4$ and $N_2$. A p-type diffusion region 21 was formed from the upper portion of the silicon substrate by ion implantation. This diffusion region was disposed in order to improve separation of the picture elements. Next, silicon was locally oxidized in the atmosphere of $H_2:O_2 = 1:8$, thereby forming as $SiO_2$ layer 22. This process is a local oxidation process of silicon that is generally referred to as an LOCOS. The abovementioned $Si_3N_4$ film and $SiO_2$ film were once removed and a gate insulation film of an MOS transistor was formed by the SiO₂ film. Next, a gate portion 25 by poly-silicon and diffusion regions 26, 27 were formed and an SiO₂ film 28 was formed thereon. Into this film were bored electrode extension ports of source 26 and drain 27 by etching (FIG. 5). As a drain electrode 29, Al was vacuum-evaporated in a thickness of 8,000 Å. Further, a SiO₂ film was formed in a thickness of 7,500 Å, followed by vacuum deposition of 1 μm-thick Al as the source electrode 31. Further, a Ta layer 32 was sputter-evaporated in a thickness of 100 Å. FIG. 6 is a sectional view showing this state. Incidentally, the electrode 31 was formed in such a manner as to cover the regions 26, 27 and the gate portion. This arrangement was employed because if the light enters the signal processing region between the diffusion layers 21 for the element separation, it causes undesirable blooming.

Figure 8:
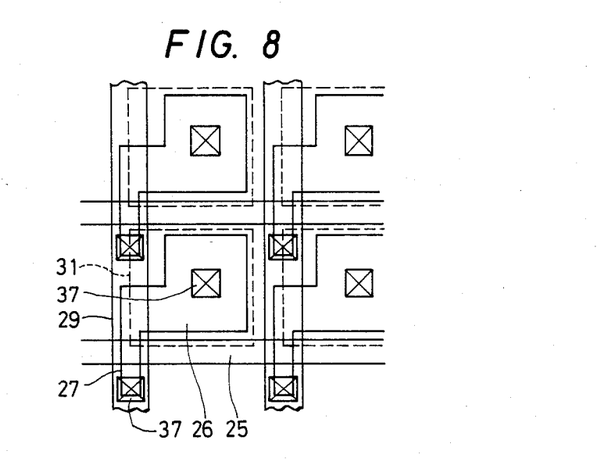
FIG. 8 is a plan view of the solid stage imager element of the embodiment of the present invention.

Circuits such a shift registers and the like were disposed around the light-receiving region. Thus, the scanning circuit portion was completed. The light-receiving portion was formed at the upper portion of this scanning circuit portion. FIG. 8 is a plan view of the Si substrate portion. Reference numeral 37 represents an electrode contact hole. In the drawing, the same reference numerals as those in the sectional view represent the same constituents.

Next, an amorphous silicon layer 33 containing 15 atom% of hydrogen was formed in a thickness of 2 μm by the reactive sputtering process.

A transparent electrode 35 was formed on this amorphous silicon layer, thereby providing the solid state imager. As the transparent electrode, it is possible to use a ultra-thin film of gold or the like or a transparent electro-conductive film containing indium oxide or tin oxide, or a ribbon-like metallic film.

Finally, a conductive film 36 of an ohmic contact was disposed on the other surface of the semiconductor substrate 20. Generally, this conductive film 36 is grounded through a terminal.

Cr-Au was vacuum-evaporated at a part of the transparent electrode using a mask and wire-bonding was effected at this portion to form a biasing electrode.

In this manner, the solid state imager using the amorphous silicon as the photoconductive film was completed (FIG. 7). As the Ta layer 32 was disposed at the upper portion of the substrate on which the amorphous silicon film 33 was to be formed, the film peeling of the amorphous silicon film could be perfectly eliminated. Thus, it became possible to eliminate white damages due to the film peeling of the picture surface of the solid state image pick-up element.

Figure 9:
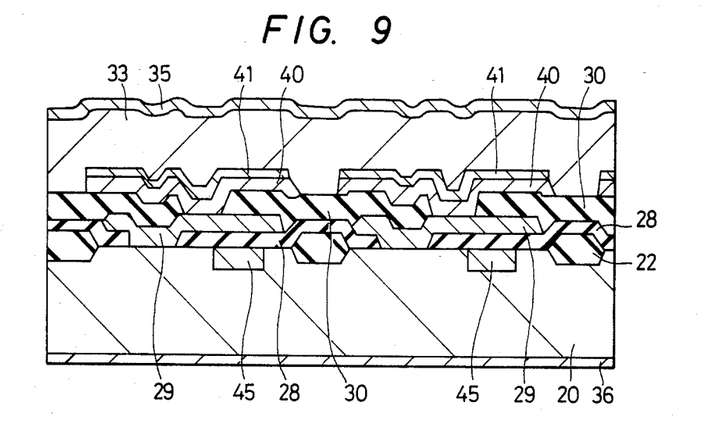
FIGS. 9 and 10 are sectional views showing the principal portions of the photoelectric conversion element in accordance with another embodiment of the present invention.

The embodiments that have been described with reference to FIGS. 5 through 7 are those in which the metal layer to serve as the adhesive layer is laminated on the metal layer as the electrode. In the solid state imager, the electrode 31 per se may consist of a metal which is to serve as the adhesive layer. It goes without special noting, further, that the construction of the electrode portion is not specifically restricted to the one used in this embodiment. FIG. 9 shows an example in which the present invention was applied to an electrode having a two-layered construction. Its fundamental construction is the same as those of the foregoing examples. Reference numeral 45 represents an impurity layer. Reference numeral 20 represents the silicon substrate and 22 does an insulation film for separating the picture elements, the film consisting of SiO₂ or the like. Reference numeral 28 represents an insulation film consisting of SiO₂ or P-containing SiO₂. A lower electrode 29 consisting of Al was disposed on the insulation film 28 and an upper electrode 40 was formed further thereon via the insulation film 30. The metallic film 41 in accordance with the present invention was formed by Ta on the upper electrode 40. In the same way as in the foregoing examples, the photoconductive film 32 and the transparent electrode 35 were sequentially formed, thereby providing the solid state image pick-up element.

Although the scanning circuit in this example consisted of MOS field effect transistors, the present invention is not restricted to this construction, in particular. It is of course possible to use a CCD (Charge Coupled Device) transfer region as the scanning circut, for example. It is further possible to use MOS transistors or other circuit systems.

When each of the metals to serve as the adhesive layer shown in the aforementioned Table 1 was used, the same effect could be obtained.

The present invention can be adapted to photoelectric conversion devices of various modified constructions using the amorphous material consisting of silicon as the principal component and containing hydrogen, and also using a rectification contact type construction. The present invention provides, for example, an improved construction of a light-receiving surface which can sufficiently restrict the dark current even when a strong electric field is applied to the interface of junction.

In accordance with the improved construction to accomplish the abovementioned object, a film layer consisting principally of at least one of oxides, nitrides and halides selected from the group listed below is interposed between the photoconductive layer consisting of H-containing amorphous material and a signal electrode.

(1) Oxides
Oxides of at least one element selected from the group consisting of Si, Ti, Al, Mg, Ba, Ta, W, Bi, V, Ge, Ni, Th, Mo, Fe, La, Be, Sc and Co.
Definite examples include SiO₂, TiO₂, Al₂O₃, MgO, BaO, Ta₂O₅, WO₃, Bi₂O₃, V₂O₅, GeO, NiO, ThO₂, Fe₂O₃, La₂O₃, MoO₃, BeO, Sc₂O₃, Co₂O₃ and their eutectic mixtures.

(2) Nitrides
Nitrides of at least one element selected from the group consisting of Ga, Si, Mg, Ta, Hf, Zr, Nb and B.
Definite examples include GaN, Si₃N₄, Si₂N₃, MgN₂, TaN, HfN, ZrN, NbN, Bn and their eutectic mixtures.

(3) Halides
Halides of at least one element selected from the group consisting of Na, Mg, Li, Ba, Ca and K.
Definite examples include MgF₂, LiF, NaF, BaF₂, CaF₂, KF and their eutectic mixtures.

It is also possible to use a layer of their mixture or a laminate layer of their mixture.

Especially, SiO₂, BaO, TiO₂, Ta₂O₅ and Al₂O₃ as the oxide, Si₃N₄ and TaN as the nitride and LiF and MgF₂ as the halide exhibit extremely excellent characteristics, followed by MgO, WO₃, V₂O₅, NiO, Fe₂O₃, MoO₃ and Co₂O₃ as the oxide, GaN, Si₂N₃ and MgN₂ as the nitride and BaF₂, NaF and KF as the halide. Good characteristics can also be obtained from Bi₂O₃, GeO, ThO₂, La₂O₃, BeO and ScO₃ as the oxide, HfN, ZnN, NbN and BN as the nitride.

The film thickness ranges from about 50 Å to about 5,000 Å. Especially when the film thickness is below 1,000 Å, there occurs no problem such as decrease in the transmissivity of the incident light or lowering of the sensitivity of the photoelectric conversion device.

Generally, it is extremely preferable that the above-mentioned oxide layer be formed by the sputtering vacuum deposition process using the same oxide as the material for vacuum deposition.

The sputtering vacuum deposition generally uses high frequency discharge in the Ar gas of $1 \times 10^{-1}$ Torr to $1 \times 10^{-3}$ Torr. If the oxide is likely to be reduced and to become blackened in this instance, it is advisable to blend up to about 5% by volume of oxygen with the Ar gas.

Though the temperature of the substrate during vacuum evaporation may be 25 to 400° C., it is preferably from 100° to 250° C. in order to prepare a film having good flatness.

Incidentally, the film layer of the abovementioned oxide, nitride or halide is interposed between the photoconductive film and the signal electrode, but it is not always necessary that the film is disposed close to the signal electrode. In other words, a layer consisting of other materials may be interposed between the signal electrode and the film layer. However, it is necessary that the photoconductive film and the oxide be substantially close to each other.

Figure 10:
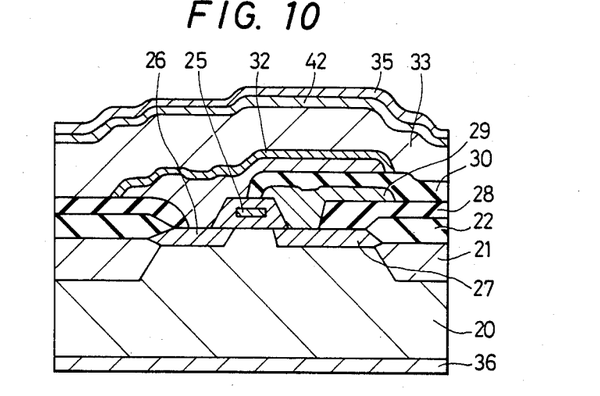

FIG. 10 is a sectional view of the abovementioned target of the improved type. Reference numeral 42 represents the abovementioned film layer for restricting the dark current. The other constituents are the same as those of FIG. 7 and are represented by the same reference numerals. The thin film layers shown in the following tables 2 and 3 were employed as the layer 42, respectively, but film peeling of the conductive film did not occur at all and the dark current could be restricted to a sufficiently low level even at a high target voltage.

TABLE 2

|  | Ar gas pressure (Torr) | High frequency output (W/cm$^2$) | Film thickness (Å) |
|---|---|---|---|
| TiO$_2$ | $4 \times 10^{-2}$ | 1 | 200 |
| BaO | $5 \times 10^{-3}$ | 1.5 | 240 |
| Ta$_2$O$_3$ | $5 \times 10^{-3}$ | 2 | 200 |
| Al$_2$O$_3$ | $3 \times 10^{-2}$ | 1.5 | 200 |
| MgO | $2.5 \times 10^{-3}$ | 0.5 | 220 |
| WO$_3$ | $5 \times 10^{-3}$ | 2 | 260 |
| V$_2$O$_5$ | $5 \times 10^{-3}$ | 2 | 250 |
| MoO$_3$ | $4 \times 10^{-3}$ | 1.7 | 200 |
| La$_2$O$_3$ | $2 \times 10^{-3}$ | 1 | 250 |
| SiO$_2$ | $1 \times 10^{-3}$ | 1 | 200 |

TABLE 3

|  | Fabrication method of blocking layer | Film thickness (Å) |
|---|---|---|
| Si$_3$N$_4$ | Decomposition by glow discharge | 220 |
| TaN | Reactive sputtering | 150 |
| LiF | Vacuum evaporation | 160 |
| MgF$_2$ | Electron beam evaporation | 200 |
| GaN | Reactive sputtering | 210 |
| MgN$_2$ | Reactive sputtering | 200 |
| CaF$_2$ | Electron beam evaporation | 220 |

TABLE 3-continued

|  | Fabrication method of blocking layer | Film thickness (Å) |
|---|---|---|
| BaF | Electron beam evaporation | 240 |
| ZrN | Reactive sputtering | 280 |
| NaF | Vacuum evaporation | 200 |

What is claimed is:

1. In a photoelectric conversion element including at least a first electrode and a photoconductive layer having an amorphous material whose indispensable constituent is silicon and which contains hydrogen as an essential constituent element on a predetermined substrate, the improvement wherein said layer of the amorphous material is disposed on said first electrode via a light transmitting or semi-light transmitting metallic film for adhesion relative to said amorphous material, and said metallic film for adhesion consists of a metallic layer consisting essentially of at least one element selected from the group consisting of Ta, Cr, W, Nd, Mo, V and Ti.

2. The photoelectric conversion element as defined in claim 1 wherein said substrate is a light transmitting substrate and said first electrode is a transparent electrode.

3. The photoelectric conversion element as defined in claim 1 wherein said substrate includes an electronic circuit for driving said photoelectric conversion element in or at the upper portion thereof, said first electrode is electrically connected to said electronic circuit and a light transmitting or light semi-transmitting second electrode is disposed further on said photoconductive layer.

4. The photoelectric conversion element as defined in claim 1, the improvement wherein said amorphous material consists essentially of at least 50 atomic-% of silicon and 5 to 50 atomic-% of hydrogen and has a resistivity of at least $10^{10}$ ohm·cm.

5. The photoelectric conversion element as defined in claim 1, the improvement wherein said amorphous material is a material in which 0.1 to 50 atomic-% of the silicon is substituted by germanium.

6. The photoelectric conversion element as defined in claim 1, the improvement wherein said metallic layer has a thickness in the range of 5 Å to 200 Å.

7. A solid state imaging device comprising at least a first electrode and a photoconductive layer having an amorphous material whose indispensible constituent is silicon and which contains hydrogen as an essential constituent element on a pre-determined substrate, the improvement wherein said layer of the amorphous material is disposed on said first electrode and said first electrode is formed of a metallic layer that promotes adhesion relative to said amorphous material; said metallic layer consisting essentially of at least one element selected from the group consisting of Ta, Cr, W, Nd, Mo, V and Ti, and having a thickness in the range of 5 Å to 200 Å.

8. The photoelectric conversion element as defined in claim 1, the improvement wherein said metallic layer consists of at least one element selected from the group consisting of Ta, Cr, W, Nd, Mo, V and Ti.

9. A solid state imaging device according to claim 7, wherein said metallic layer consists of at least one element selected from the group consisting of Ta, Cr, W. Nd, Mo, V and Ti.

* * * * *